United States Patent
Liu et al.

(10) Patent No.: US 11,258,356 B2
(45) Date of Patent: Feb. 22, 2022

(54) MAGNETIC BARRIER FOR POWER MODULE

(71) Applicant: Analog Devices International Unlimited Company, Limerick (IE)

(72) Inventors: Zhengyang Liu, Pleasanton, CA (US); David Roy Ng, San Jose, CA (US)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 16/528,233

(22) Filed: Jul. 31, 2019

(65) Prior Publication Data
US 2021/0036602 A1  Feb. 4, 2021

(51) Int. Cl.
G05F 1/10 (2006.01)
G05F 3/02 (2006.01)
H02M 1/44 (2007.01)
H05K 1/18 (2006.01)
H02M 1/00 (2006.01)

(52) U.S. Cl.
CPC .............. H02M 1/44 (2013.01); H05K 1/181 (2013.01); *H02M 1/0045* (2021.05)

(58) Field of Classification Search
CPC ................................. H02M 1/44; H05K 1/181
USPC ......................................................... 327/540
See application file for complete search history.

(56) References Cited

U.S. PATENT DOCUMENTS

| | | | |
|---|---|---|---|
| 6,614,102 B1 | 9/2003 | Hoffman et al. | |
| 6,906,396 B2 | 6/2005 | Tuttle et al. | |
| 7,459,769 B2* | 12/2008 | Kato | G11C 11/16 257/659 |
| 7,545,662 B2 | 6/2009 | Wang et al. | |
| 8,890,368 B2 | 11/2014 | Posat et al. | |
| 9,240,390 B2 | 1/2016 | Kuo et al. | |
| 9,450,547 B2 | 9/2016 | Szymanowski et al. | |

(Continued)

FOREIGN PATENT DOCUMENTS

| | | |
|---|---|---|
| CN | 104993603 B | 10/2018 |
| JP | S5880719 U | 5/1983 |

(Continued)

OTHER PUBLICATIONS

Owen, Todd, et al., "Measuring 2nV//Hz and 120dB Supply Rejection on Linear Regulators", Linear Technology Application Note 159, (Feb. 2016), 20 pgs.

(Continued)

*Primary Examiner* — Metasebia T Retebo
(74) *Attorney, Agent, or Firm* — Schwegman Lundberg & Woessner, P.A.

(57) ABSTRACT

A cascaded configuration of regulator circuits can be co-integrated within a commonly-shared integrated circuit package (such as an integrated electronic module). Such co-integration can include placing a switched-mode regulator circuit in close proximity to a linear regulator circuit. Magnetic field coupling between the regulator circuits is generally a non-linear function of a separation between the circuits. The switched-mode regulator circuit can generate noise that may adversely impact the linear regulator output. Magnetic coupling between the regulator circuits within the module package can be suppressed or eliminated using a magnetic barrier. The barrier can be magnetically permeable and electrically non-conductive.

20 Claims, 4 Drawing Sheets

(56) References Cited

U.S. PATENT DOCUMENTS

| | | |
|---|---|---|
| 9,673,164 B2 | 6/2017 | Watts et al. |
| 9,986,639 B2 | 5/2018 | Limjoco et al. |
| 10,177,608 B2 | 1/2019 | Pooley |
| 10,892,230 B2 * | 1/2021 | Lu .................. H01L 23/295 |
| 2003/0042596 A1 | 3/2003 | Crane et al. |
| 2003/0090255 A1 * | 5/2003 | Bassett .................. H02J 1/102 |
| | | 323/284 |
| 2007/0153491 A1 | 7/2007 | Lee |
| 2011/0001587 A1 | 1/2011 | Sutardja |
| 2014/0022020 A1 | 1/2014 | Aaen et al. |
| 2015/0312983 A1 * | 10/2015 | Hu ........................ F21K 9/23 |
| | | 315/186 |
| 2016/0155706 A1 | 6/2016 | Yoneyama et al. |
| 2016/0380606 A1 * | 12/2016 | Limjoco ................ H05K 1/181 |
| | | 361/767 |
| 2017/0244318 A1 | 8/2017 | Giuliano |
| 2018/0109246 A1 | 4/2018 | Zaplana |

FOREIGN PATENT DOCUMENTS

| | | |
|---|---|---|
| JP | 2001069764 A | 3/2001 |
| JP | 2013143453 A | 7/2013 |

OTHER PUBLICATIONS

Williams, Jim, "A Monolithic Swiching Regulator with 100mV Output Noise", Linear Technology Application Note 70, (Oct. 1997), 72 pgs.

Williams, Jim, "Minimizing Switching Regulator Residue in Linear Regulator Outputs", Linear Technology Application Note 101, (Jul. 2005), 12 pgs.

* cited by examiner

MAGNETIC BARRIER FOR POWER MODULE

FIELD OF THE DISCLOSURE

This document pertains generally, but not by way of limitation, to apparatus and techniques that can be used for providing a regulated output signal using regulator circuits, such as including isolating such circuits magnetically from each other.

BACKGROUND

Various regulator circuit topologies can be used to receive an input signal, such as an unregulated voltage or current, and to regulate such a signal such as to provide power to one or more downstream devices. Such regulation can include providing one or more of a controlled output voltage or current, for example. A regulator circuit can include an integrated circuit device, such as a monolithic integrated circuit die. Generally, a monolithic integrated circuit die can include one or more of active devices such as transistors, or passive devices such as resistors, inductors, or capacitors, and interconnections. Such a monolithic integrated circuit die can be fabricated upon or can otherwise include a semiconductor substrate. Limitations can exist with respect to a magnitude of passive component values that can be implemented using monolithic integrated circuits. Accordingly, in certain applications, a monolithic integrated circuit die can be coupled to one or more components located "off-chip," but such components may still be included within an integrated electronic module package.

In one approach, a regulator circuit can operate using a switched-mode regulation scheme where energy is selectively provided to a storage element, such as an inductor, during a first duration, then dumped from the inductor into an output load, during a second duration. In one illustrative application, a monolithic integrated circuit can include a switched-mode power supply controller circuit such as including one or more of analog or digital circuitry forming a portion of a regulated power supply. A combination of the integrated circuit die and other off-chip components can provide a regulated power supply circuit. Components separate from the integrated circuit can include an energy storage element (e.g., the inductor), and other circuitry such as one or more large bypass capacitors or power switching devices (e.g., power transistors).

SUMMARY OF THE DISCLOSURE

An integrated circuit module, such as a "power module" incorporating one or more integrated circuit dice, can provide a regulation function as mentioned above. In one approach, a cascaded configuration of regulator circuits can be used. For example, in an electronic module, a switched-mode regulator circuit and a linear regulator circuit can be used together in a cascaded manner. The linear regulator can provide an output having low noise and a higher power-supply rejection ratio as compared to the switched-mode regulator. In an example, the switched-mode regulator can be arranged as a "pre-regulator" and an output of the switched-mode regulator can be coupled to an input of the linear regulator such that the linear regulator operates as a "post regulator."

A cascaded configuration of regulator circuits can be co-integrated within a commonly-shared integrated circuit package (such as an integrated electronic module). Generally, such co-integration places a switched-mode regulator circuit in close proximity to a linear regulator circuit. Magnetic field coupling between the regulator circuits is generally a non-linear function of a separation between the circuits. Accordingly, in a compact module configuration, the present inventors have recognized, among other things, that significant magnetic coupling can occur between a switched-mode regulator circuit and a nearby linear regulator circuit. For example, the switched-mode regulator circuit can generate noise that may adversely impact the linear regulator output (e.g., including shot noise or other transients such as associated with switching events as the switched-mode regulator circuit operates) when such circuits are in close proximity. To remedy such a challenge, the present inventors have recognized that magnetic coupling between the regulator circuits within the module package can be suppressed or eliminated using a magnetic barrier. The magnetic barrier can include a non-conductive material that is magnetically permeable. For example, a ferrite magnetic barrier can be placed between integrated circuit dice within an integrated module package to provide magnetic isolation between adjacent circuits, without requiring a bulky shield around an entirety of the integrated module package.

In an example, an apparatus such as a system can include or can use an electronic circuit assembly including magnetic field isolation between cascaded regulator circuit blocks, the electronic circuit assembly comprising a switched-mode regulator circuit comprising a first integrated circuit die, a linear regulator circuit coupled to an output of the switched-mode regulator circuit, the linear regulator circuit comprising a second integrated circuit die, and a magnetic barrier located between the first and second integrated circuit dice, the magnetic barrier comprising a magnetically-permeable material to suppress or inhibit magnetic flux from coupling between the switched-mode regulator circuit and the linear regulator circuit. The magnetic barrier can include a non-conductive, magnetically-permeable material.

In an example, a technique, such as a method, can include suppressing magnetic field interference between cascaded regulator circuit blocks, the method comprising pre-regulating an input voltage using a switched-mode regulator circuit, receiving an output voltage from the switched-mode regulator circuit across a magnetic barrier, and post-regulating the received output voltage from the switched-mode regulator circuit using a linear regulator circuit. Generally, the magnetic barrier can be located between the switched-mode regulator circuit and the linear regulator circuit and suppresses or inhibits magnetic flux from coupling between the switched-mode regulator circuit and the linear regulator circuit.

Generally, the examples described in this document can be implemented in whole or in part within an integrated circuit package or module.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Voltage regulator circuits can be used in a wide variety of applications, such as to receive an input signal (e.g., an input voltage), and to provide a regulated output signal (e.g., a regulated output voltage). In applications where the input signal varies across a wide range or has a magnitude that is lesser or greater than a desired output voltage, a switched-mode regulator can be used. As mentioned above, in a switched-mode circuit topology, at least one switch (e.g., a transistor or other device) can be switched on and off to selectively charge an energy storage device. The stored energy can then be transferred to a load either using active (switched) rectification or passive rectification schemes. A variety of switched-mode regulator topologies can be used depending on whether the input signal is to be stepped up (e.g., "boosted"), stepped down (e.g., "bucked"), or both. Use of switched-mode regulator circuits can present challenges. For example, an output of a switched-mode regulator circuit generally includes significant noise or ripple content related to switching transitions or other time-varying signals associated with operation of the switched-mode regulator circuit. Some downstream circuits may have specifications that desire or require suppression of such ripple or noise. In one approach, large "passive" filter circuits can be used, such as including large capacitors.

Other regulator circuit topologies can be used. For example, linear regulator circuits provide lower noise at their output than switched-mode regulator circuits. Linear regulator circuits, alone, can present drawbacks such as that an output voltage of a linear regulator circuit is generally lower than the input voltage, because linear regulator circuits generally use either a series or shunt element to provide regulation, and such elements generate losses and an associated voltage drop. The present inventors have recognized that a linear regulator circuit can be used in combination with a switched-mode regulator circuit in a cascaded manner, where an output of a switched-mode regulator is provided as an input to a linear regulator. In this manner, the efficiency and flexibility of a switched-mode regulator circuit is preserved, and the linear regulator circuit can help to suppress noise generated by the switched-mode regulator circuit.

In particular, the present inventors have devised apparatus and techniques to integrate a switched-mode regulator circuit and a linear regulator circuit within a single integrated module package, including magnetic isolation between the switched-mode regulator circuit and the linear regulator circuit. Such an approach can be contrasted with other approaches, such as where a conductive shield is placed around an entire module package. The present subject matter does not require that the shield be conductive, and the magnetic barrier configurations described herein are generally located between laterally-separated circuit blocks. A magnetic barrier as described herein can include an electrically non-conductive magnetically-permeable material (e.g., a material having a relative magnetic permeability (e.g., "$\mu/\mu_0$") much greater than unity, such as a value of at least 100, or at least 500, or at least 1000, as illustrative examples). For example, ferrite materials can be used. The magnetic barrier need not be conductively electrically coupled to other portions of the integrated module package, unlike configurations that use a conductive shield. This can simplify an electrical design of the module package, and may help to suppress spatial coupling (e.g., capacitive or inductive) between adjacent regulator circuits.

Figure 1:
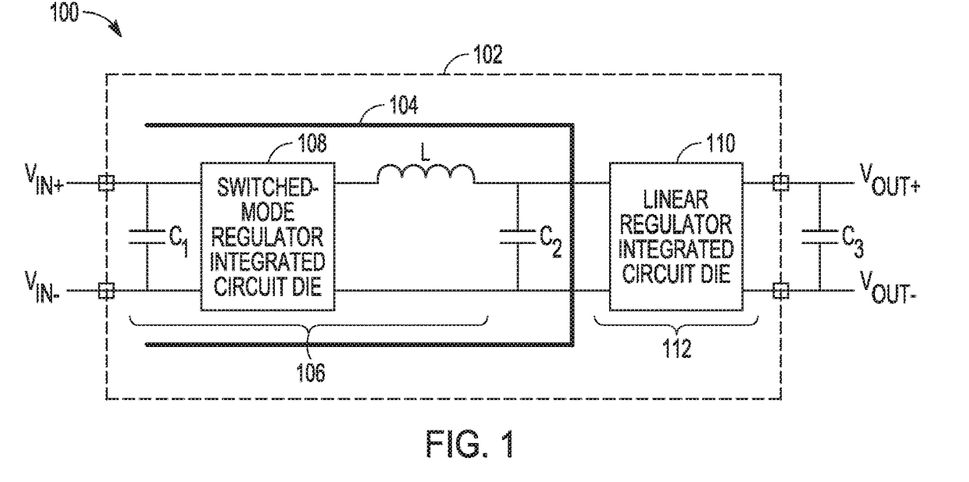
FIG. 1 illustrates generally an example comprising an electronic circuit that can form a portion or an entirety of an electronic circuit assembly, comprising a switched-mode regulator circuit and a linear regulator circuit in a cascaded configuration.

FIG. 1 illustrates generally an example comprising an electronic circuit 100 that can form a portion or an entirety of an electronic circuit assembly such as an integrated module package 102. The circuit 100 can include a switched-mode regulator circuit 106 and a linear regulator circuit 112 in a cascaded configuration. For example, an input signal such as a voltage can be coupled to input terminals of the circuit 100, represented by VIN+ and VIN−. An input capacitor C1 can be included as a portion of the circuit 100, coupled to a switched-mode regulator integrated circuit die 108 (e.g., including one or more control circuits, oscillators, feedback circuits, transistor switches or other switches, protection circuits, or other circuitry to provide a switched-mode regulation behavior). An energy storage device such as an inductor, L, can be energized by the switched-mode regulator integrated circuit die 108 to store energy using the inductor, L. Energy can then be transferred from the inductor, L, to downstream circuitry, such as an intermediate output shunt capacitor C2 located between an output node and a reference node.

The output from the switched-mode regulator circuit 106 can be conductively coupled to the linear regulator circuit 112, such as by coupling output nodes of the switched-mode regulator circuit 106 to a linear regulator integrated circuit die 110. In this manner, the linear regulator circuit 112 can assist in suppressing noise generated by the switched-mode regulator circuit 106. An output filter capacitor C3 can be included to provide filtering or to supply transient output current, and such a filter capacitor C3 may be located outside the package 102. Use of the linear regulator circuit 112 can allow smaller-valued capacitors C2 or C3 as compared to other approaches, because the linear regulator circuit 112 can provide reduced output noise as compared to a circuit topology lacking the linear regulator circuit 112. However, when the linear regulator circuit 112 is co-integrated within the package 102 with the switched-mode regulator circuit, unwanted magnetic coupling between the circuits can occur resulting in noise at the linear regulator circuit 112 output (e.g., across output nodes VOUT+ and VOUT−).

The present inventors have recognized that a magnetic barrier 104 can be included, such as between the switched-mode regulator integrated circuit die 108 and the linear regulator integrated circuit die 110. The magnetic barrier can be a simple vertical "wall" within the package 102 or can include arms forming a "U" shape as shown illustratively in FIG. 1, or in FIG. 2A and FIG. 2B. Other shapes can be used, such as a "C" shape, an "I" shape, an "L" shape, and "X" shape or other various shapes such as annular shapes. For example, the magnetic barrier 204 need not be symmetric.

As mentioned elsewhere herein, the magnetic barrier 104 can include a magnetically-permeable material to capture flux generated by current loops formed by the switched-mode regulator circuit 106, and to inhibit coupling of such flux to other circuitry. Use of arms as shown herein helps to further contain magnetic flux, such as suppressing magnetic flux leakage or fringing along the edges of the circuit 100. The switched-mode regulator circuit 106 topology shown in FIG. 1 is an illustrative example, and other switched-mode supply configurations can be used in combination with the magnetic barrier 104 and a linear regulator circuit 112. The magnetic barrier 104 need not be conductive, and can include a ferrite material, for example.

Figure 2A:
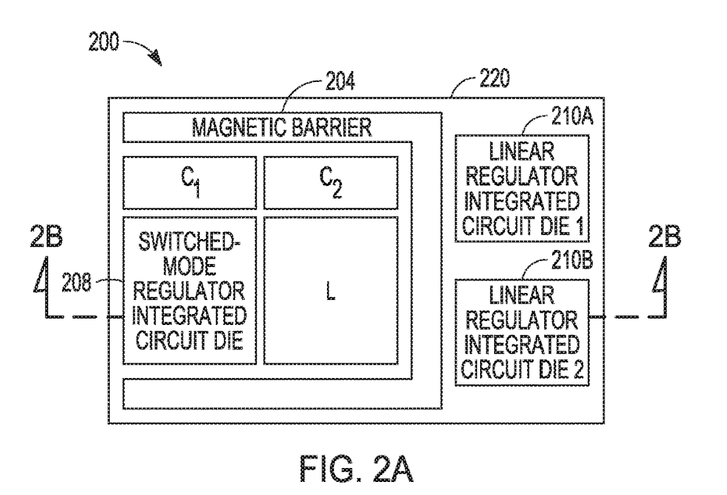
FIG. 2A and FIG. 2B illustrate generally respective views of an electronic circuit assembly, such as an integrated module package, that can include a cascaded configuration of regulator circuits, with FIG. 2B representing a section view of a portion of the circuit.
Figure 2B:
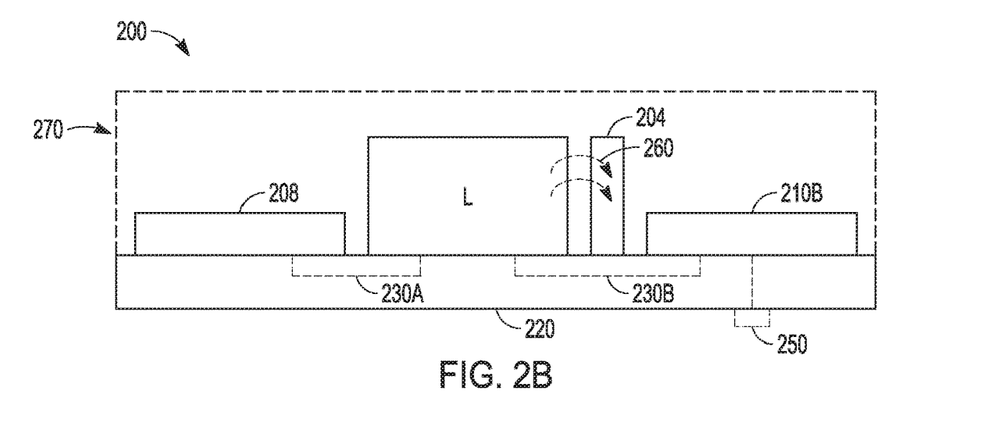

FIG. 2A and FIG. 2B illustrate generally respective views of an electronic circuit assembly 200, such as an integrated module package, that can include a cascaded configuration of regulator circuits, with FIG. 2B representing a section view of a portion of the circuit 200. Generally, a magnetic barrier 204, such as a ferrite structure, can be located between integrated circuit dice, such as to magnetically isolate at least a switched-mode regulator integrated circuit die 208 from one or more linear regulator circuit dice, such as a first linear regulator integrated circuit die 210A and a second linear regulator integrated circuit die 210B. The circuit 200 can include a module assembly having a substrate 220 (e.g., a ceramic substrate, a semiconductor substrate, or a laminate such as a glass-epoxy or other laminate). The magnetic barrier 204 can be shaped to suppress mutual magnetic coupling between likely sources of magnetic flux within the switched mode regulator circuit and the one or more linear regulator circuits 210A, 210B. For example, the substrate 220 can include one or more conductive traces on or within the substrate 220, such as a first trace 230A coupling a signal from the switched-mode integrated circuit die 208 to the inductor, L. The first trace 230A can form a portion of a loop, such as including the inductor, that can generate magnetic flux 260. The magnetic barrier 204 can concentrate such flux and divert it away from other portions of the circuit 200. An output trace 230B from the switched-mode regulator circuit can be routed to an input of at least one of the linear regulator integrated circuit dice (e.g., the second integrated circuit die 210B as shown illustratively in FIG. 2B), and an output of the second integrated circuit die 210B can be coupled to a terminal 250 such as a bump, a land, a pin, or other conductive structure included as a portion of the circuit 200. Layout of traces such as the output trace 230B can help to provide a low-noise output. For example, if the output trace 230B has a current flowing a first direction, a similar return trace or return plane can be located on a nearby layer of the substrate 220. A magnetic field generated by the output trace 230B can be suppressed or inhibited by a mirror-image current flowing on the nearby return trace or return plane. In this sense, a loop area formed by the source and return trace circuit can be reduced or minimized.

Generally, the magnetic barrier 204 can include a magnetically-permeable material such as a ferrite, but such material need not be electrically conductive. For example, the substrate 220 need not include a conductive electrical coupling to the magnetic barrier 204. This simplifies the electrical design of the substrate 220 and allows the magnetic barrier to be located in close proximity to the switched-mode regulator circuit components, facilitating production of a compact assembly.

Use of the magnetic barrier 204 is generally compatible with other integrated module processing, such as supporting automated pick-and-place where the magnetic barrier 204 is placed along with other components using surface mount technology (SMT) component processing technology. A lid, cover, or over-mold may be used to house the circuit 200. For example, during production, an over-mold compound 270 can easily flow around the magnetic barrier 204, such as avoiding voids or other imperfections. Such an overmold 270 can encapsulate the magnetic barrier 204 in the same manner as occurs for other surface-mount components such as the inductor, L, input capacitor C1, shunt capacitor C2, or other components. In this manner, a compact module assembly can be provided having magnetic isolation between the switched-mode regulator portion of the circuit 200 and the one or more linear regulator portions.

Various techniques can be used to anchor the magnetic barrier 204 to the substrate 220, such as by using an adhesive to adhere the barrier 204 to the substrate 220 or using other techniques such as a slot or other feature on or within the substrate 220 to retain or hold captive the barrier 204. If a lid is used, the magnetic barrier 204 may be attached to the lid so that the barrier 204 is located in a specified position when the lid is mated with the remainder of the circuit 200.

Figure 3A:
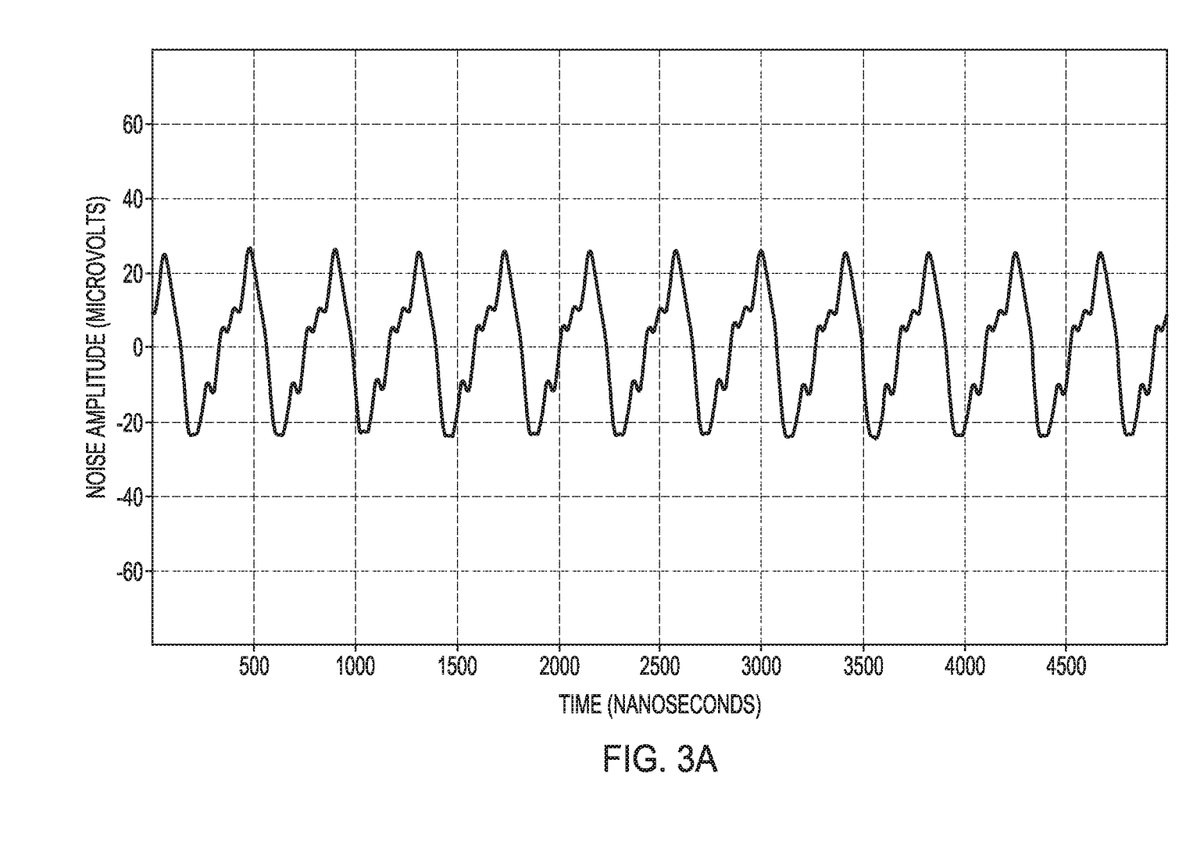
FIG. 3A and FIG. 3B illustrate generally respective views of experimentally-obtained noise measurements performed on a cascaded arrangement of regulator circuits, with FIG. 3A showing a time-domain noise profile in the absence of a magnetic barrier, and FIG. 3B showing a time-domain noise profile with a magnetic barrier present between a switched-mode regulator circuit and a linear regulator circuit, corresponding to the arrangements of FIG. 1, FIG. 2A, and FIG. 2B.
Figure 3B:
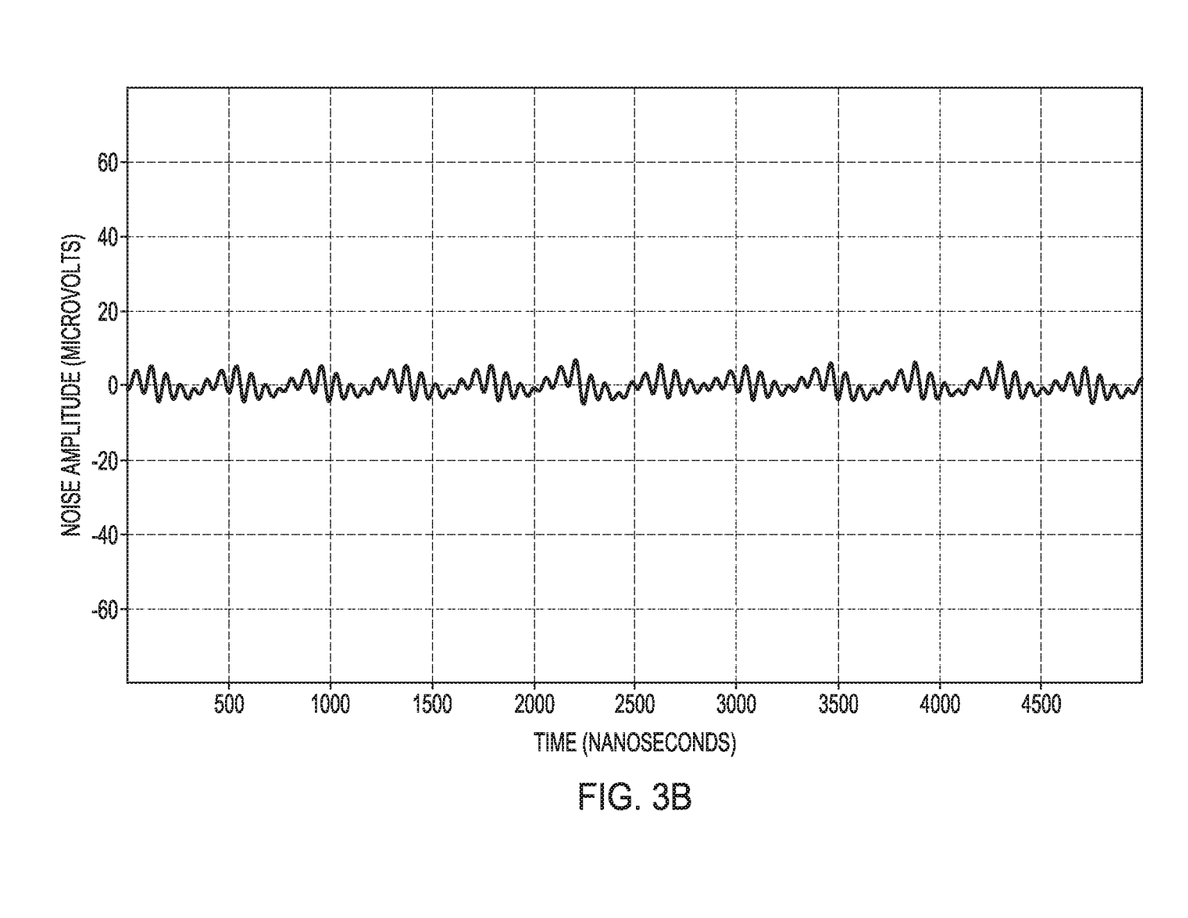

FIG. 3A and FIG. 3B illustrate generally respective views of experimentally-obtained noise measurements performed on a cascaded arrangement of regulator circuits, with FIG. 3A showing a time-domain noise profile in the absence of a magnetic barrier, and FIG. 3B showing a time-domain noise profile with a magnetic barrier present between a switched-mode regulator circuit and a linear regulator circuit, corresponding to the arrangements of FIG. 1, FIG. 2A, and FIG. 2B. In FIG. 3A, the time-domain waveform represents an experimentally-obtained measurement of an output voltage ripple at an output of a linear regulator circuit, where the linear regulator circuit is fed by a switched-mode regulator circuit without a magnetic barrier. The output voltage root-mean-square (RMS) value is around 15 microvolts, and the peak-to-peak value is about 51 microvolts. Referring to FIG. 3B, the time-domain waveform represents an experimentally-obtained measurement of an output voltage ripple of a similar configuration as shown in FIG. 3A, but with a magnetic barrier between the regulator circuits. The output voltage RMS value has decreased to about 2.4 microvolts, and the peak-to-peak value has decreased to about 12.2 microvolts, showing a significant reduction in output ripple voltage under similar loading.

Figure 4:
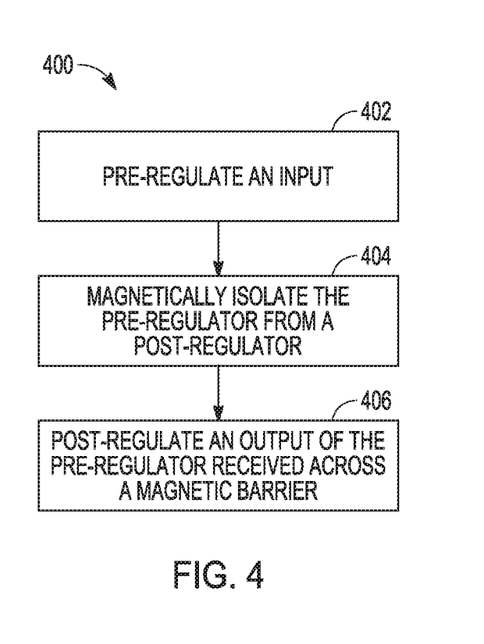
FIG. 4 illustrates generally a technique, such as a method, comprising pre-regulating an input, such as an input voltage, and post-regulating an output of the pre-regulator received across a magnetic barrier, wherein the technique can include magnetically isolating the pre-regulator from the post regulator.

FIG. 4 illustrates generally a technique 400, such as a method, comprising pre-regulating an input, such as an input voltage, at 402, and post-regulating an output of the pre-regulator at 406, received across a magnetic barrier, wherein the technique can include magnetically isolating the pre-regulator from the post regulator at 404. The technique 400 can include or can use apparatus (such as electronic circuitry) as shown and described in relation to other examples herein. For example, the circuit configuration shown illustratively in FIG. 1, FIG. 2A, or FIG. 2B can be used.

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic circuit assembly including magnetic field isolation between cascaded regulator circuit blocks, the electronic circuit assembly comprising:
   a switched-mode regulator circuit comprising a first integrated circuit die;
   a linear regulator circuit coupled to an output of the switched-mode regulator circuit, the linear regulator circuit comprising a second integrated circuit die; and
   a magnetic barrier comprising a ferrite shield located between the first and second integrated circuit dice, to suppress or inhibit magnetic flux from coupling between the switched-mode regulator circuit and the linear regulator circuit;
   wherein the magnetic barrier is conductively isolated from conductors on or within a substrate upon which the first and second integrated circuit dice are located.

2. The electronic circuit assembly of claim 1; wherein the switched-mode regulator circuit comprises an inductor; and
   wherein the magnetic barrier is arranged to magnetically isolate the inductor from the second integrated circuit die.

3. The electronic circuit assembly of claim 2, comprising a shunt capacitor located between an output node of the switched-mode regulator circuit and a reference node; and
   wherein magnetic barrier is also arranged to magnetically isolate the shunt capacitor from the second integrated circuit die.

4. The electronic circuit assembly of claim 1, wherein the linear regulator circuit is included amongst two or more linear regulator circuits; and
   wherein the magnetic barrier is arranged to magnetically isolate respective dice corresponding to the two or more linear regulator circuits from the switched-mode regulator circuit.

5. The electronic circuit assembly of claim 1, comprising a substrate upon which the first and second integrated circuit dice are located; and
   wherein the magnetic barrier is located upon the substrate and comprises a u-shaped configuration having a base region located between the first and second integrated circuit dice.

6. The electronic circuit assembly of claim 1; comprising:
   a substrate upon which the first and second integrated circuit dice are located; and
   an overmold material surrounding the magnetic barrier, and the first and second integrated circuit dice.

7. The electronic circuit assembly of claim 1, comprising conductive couplings between the switched-mode regulator circuit and the linear regulator circuit carrying complementary currents; and
   wherein the conductive couplings are arranged to overlap to reduce or minimize a loop area formed by a circuit comprising the conductive couplings.

8. A method for suppressing magnetic field interference between cascaded regulator circuit blocks, the method comprising:
   pre-regulating an input voltage using a switched-mode regulator circuit;
   receiving an output voltage from the switched-mode regulator circuit across a magnetic barrier; and
   post-regulating the received output voltage from the switched-mode regulator circuit using a linear regulator circuit;
   wherein the magnetic barrier comprises a ferrite shield located between the switched-mode regulator circuit and the linear regulator circuit and suppresses or inhibits magnetic flux from coupling between the switched-mode regulator circuit and the linear regulator circuit.

9. The method of claim 8, wherein the switched-mode regulator circuit comprises an inductor; and
   wherein the magnetic barrier magnetically isolates the inductor from the linear regulator circuit.

10. The method of claim 8, wherein the magnetic barrier is also arranged to magnetically isolate a shunt capacitor located between an output node of the switched-mode regulator circuit and a reference node from the linear regulator circuit.

11. The method of claim 8, wherein the magnetic barrier is arranged to magnetically isolate two or more linear regulator circuits from the switched-mode regulator circuit.

12. The method of claim 8, wherein the magnetic barrier is embedded in an overmold material.

13. The method of claim 12, wherein the magnetic barrier is sized and shaped to permit the overmold material to flow around the magnetic barrier to envelop the magnetic barrier without voids during fabrication.

14. An electronic circuit assembly including magnetic field isolation between cascaded regulator circuit blocks, the electronic circuit assembly comprising:
   means for performing switched-mode regulation;
   a means for performing linear regulation conductively coupled to an output of the means for performing switched-mode regulation; and
   a non-conductive shield comprising a ferrite, for magnetically isolating the means for performing switched-mode regulation from the means for performing linear regulation within an integrated circuit device package.

15. The electronic circuit assembly of claim 14, wherein the means for performing linear regulation comprises two or more linear regulator circuits; and
   wherein the non-conductive shield is arranged to magnetically isolate respective dice corresponding to two or more linear regulator circuits from the means for performing switched-mode regulation.

16. The electronic circuit assembly of claim 14, wherein the means for performing switched-mode regulation comprises an inductor; and
   wherein the non-conductive shield is arranged to magnetically isolate the inductor from the means for performing linear regulation.

17. The electronic circuit assembly of claim 14, comprising:
   a substrate; and
   an overmold material surrounding the non-conductive shield.

18. The method of claim 8, wherein the magnetic barrier comprises a u-shaped configuration having a base region located between the linear regulator circuit and the switched-mode regulator circuit.

19. The method of claim 8, wherein the magnetic barrier is conductively isolated from conductors on or within a substrate.

20. The electronic circuit assembly of claim 15, wherein the non-conductive shield comprises a u-shaped configuration.

* * * * *